US008922749B2

(12) United States Patent
Butler et al.

(10) Patent No.: US 8,922,749 B2
(45) Date of Patent: Dec. 30, 2014

(54) LITHOGRAPHIC APPARATUS AND PATTERNING DEVICE

(75) Inventors: Hans Butler, Best (NL); Erik Roelof Loopstra, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 582 days.

(21) Appl. No.: 12/913,539

(22) Filed: Oct. 27, 2010

(65) Prior Publication Data

US 2011/0096311 A1 Apr. 28, 2011

Related U.S. Application Data

(60) Provisional application No. 61/255,759, filed on Oct. 28, 2009.

(51) Int. Cl.
*G03F 7/20* (2006.01)

(52) U.S. Cl.
CPC .......... *G03F 7/7085* (2013.01); *G03F 7/70358* (2013.01); *G03F 7/70516* (2013.01)
USPC ............... 355/53; 355/52; 355/55; 355/66; 355/67

(58) Field of Classification Search
CPC ............. G03F 7/0358; G03F 7/70516; G03F 7/70591; G03F 7/706; G03F 7/70616; G03F 7/0641; G03F 7/70666; G03F 7/70683; G03F 7/7085
USPC ................ 355/39, 43, 52, 53, 55, 57, 61–63, 355/66–71, 74, 75; 250/492.1, 492.2, 250/492.22, 548; 430/5, 8, 22, 30, 311, 312
See application file for complete search history.

(56) References Cited

U.S. PATENT DOCUMENTS 4,772,119 A * 9/1988 Bouwhuis et al. ............ 356/124
5,272,501 A * 12/1993 Nishi et al. ........................ 355/53

(Continued)

FOREIGN PATENT DOCUMENTS

JP 63-001031 1/1988
JP 2-098119 4/1990

(Continued)

OTHER PUBLICATIONS

Japanese Office Action mailed Apr. 17, 2012 in corresponding Japanese Patent Application No. 2010-236005.

(Continued)

*Primary Examiner* — Toan Ton
*Assistant Examiner* — Christina Riddle
(74) *Attorney, Agent, or Firm* — Pillsbury Winthrop Shaw Pittman LLP (57) ABSTRACT

A lithographic apparatus includes a support to support a patterning device, the patterning device being capable of imparting a radiation beam with a pattern in its cross-section to form a patterned radiation beam, a substrate table constructed to hold a substrate, and a projection system configured to project the patterned radiation beam onto a target portion of the substrate. The lithographic apparatus includes a projection transfer measurement system to measure an optical projection transfer information of the projection system. The projection transfer measurement arrangement includes: an optical device to direct a measurement beam into the projection system during a scanning movement, a detector to detect the measurement beam having passed through the projection system during the scanning movement, and a measurement processor to determine the optical projection transfer information from the detected measurement beam. The optical device and the detector are arranged at an upstream end of the projection system.

12 Claims, 7 Drawing Sheets

(56) References Cited

U.S. PATENT DOCUMENTS

| | | | |
|---|---|---|---|
| 5,481,362 A * | 1/1996 | Van Den Brink et al. | 356/401 |
| 5,575,505 A | 11/1996 | Bridges | |
| 6,489,627 B1 * | 12/2002 | Sheng et al. | 250/559.4 |
| 6,646,714 B2 * | 11/2003 | Ohsaki | 355/52 |
| 6,833,906 B1 * | 12/2004 | Ohsaki | 355/69 |
| 6,867,846 B2 | 3/2005 | Poultney | |
| 7,518,703 B2 * | 4/2009 | Van De Kerkhof et al. | 355/53 |
| 2001/0012098 A1 * | 8/2001 | Mishima | 355/53 |
| 2002/0100012 A1 * | 7/2002 | Sutani et al. | 716/21 |
| 2004/0058256 A1 * | 3/2004 | Fujisawa et al. | 430/30 |
| 2004/0145714 A1 | 7/2004 | Poultney | |
| 2005/0128461 A1 * | 6/2005 | Beems et al. | 355/72 |
| 2006/0139660 A1 * | 6/2006 | Patrick Kwan | 356/614 |
| 2009/0033904 A1 * | 2/2009 | Kawashima et al. | 355/67 |
| 2010/0092882 A1 * | 4/2010 | Matsumoto | 430/30 |

FOREIGN PATENT DOCUMENTS

| | | |
|---|---|---|
| JP | 06-302499 | 10/1994 |
| JP | 09-068416 | 3/1997 |
| JP | 09-223657 | 8/1997 |
| JP | 10-064808 | 3/1998 |
| JP | 10-284369 | 10/1998 |
| JP | 2001-514804 | 9/2001 |
| JP | 2002-182369 | 6/2002 |
| JP | 2003-045795 | 2/2003 |
| TW | 200836020 | 9/2008 |
| WO | 2004/066366 | 8/2004 |

OTHER PUBLICATIONS

Chinese Office Action dated Jun. 18, 2012 in corresponding Chinese Patent Application No. 201010525965.4.

Japanese Office Action dated Jan. 28, 2013 in corresponding Chinese Patent Application No. 2010-236005.

Chinese Office Action dated Sep. 21, 2012 in corresponding Chinese Patent Application No. 201010525965.4.

Taiwan Office Action dated Jul. 4, 2013 in corresponding Taiwan Patent Application No. 099134265.

* cited by examiner

LITHOGRAPHIC APPARATUS AND PATTERNING DEVICE

CROSS REFERENCE TO RELATED APPLICATIONS

This application claims priority and benefit under 35 U.S.C. §119(e) to U.S. Provisional Patent Application No. 61/255,759, entitled "Lithographic Apparatus and Patterning Device", filed on Oct. 28, 2009. The content of that application is incorporated herein in its entirety by reference.

FIELD

The present invention relates to a lithographic apparatus and to a lithographic apparatus patterning device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to ensure that the pattern which is projected onto the substrate, is positioned correctly on the surface of the substrate, position measurement systems are provided to measure a position of the patterning device (e.g. mask) and/or patterning device support (e.g. mask table) and the position of the substrate and/or substrate table. Interferometer and/or encoder measurement systems, or combinations thereof may be provided in order to measure the respective positions. By relating the position of the patterning device (e.g. mask) to the position of the substrate, a correct imaging of the pattern onto the substrate is to be provided.

SUMMARY

It is desirable to improve a projection accuracy of the lithographic apparatus.

According to an embodiment of the invention, there is provided a lithographic apparatus including:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
the lithographic apparatus further including a projection transfer measurement arrangement to measure an optical projection transfer information of the projection system, including:
an optical device to direct a measurement beam into the projection system,
a detector to detect the measurement beam having passed through the projection system, and
a measurement processing device to determine the optical projection transfer information from the detected measurement beam, wherein the optical device and the detector are arranged at an upstream end of the projection system.

In another embodiment of the invention, there is provided a lithographic apparatus patterning device including a wedge and a grating/detector combination.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
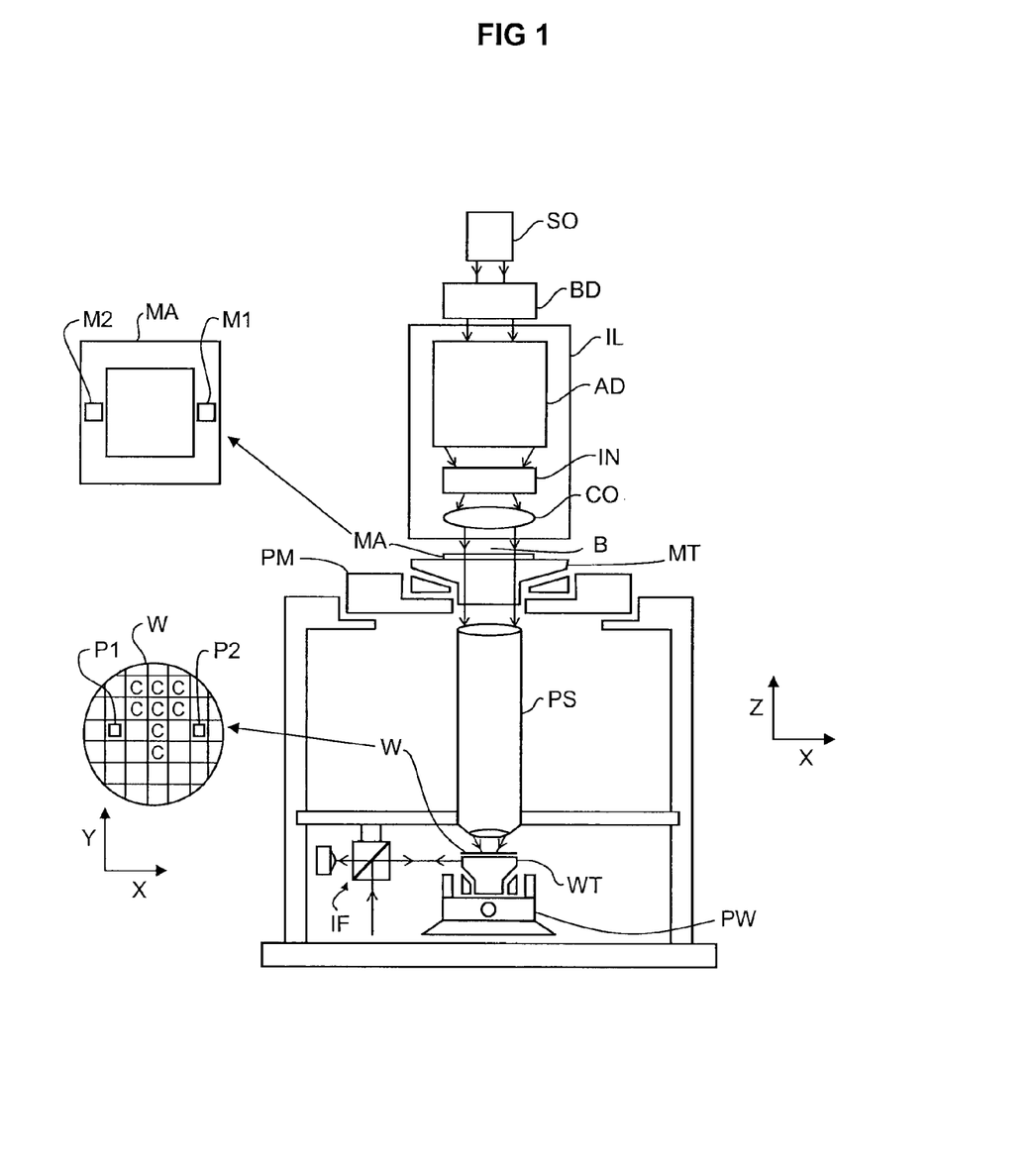
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device supports holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam 13. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the lithographic apparatus described above, the patterning device support (e.g. mask support) position is measured during exposure and scanning by a suitable measurement system (also, in some embodiments the position of the patterning device (e.g. mask) itself may be measured), and furthermore the position of the wafer table is measured during exposure and scanning. During exposure, a pattern is projected from the patterning device onto the substrate. Thereby, a position of the patterning device (and its pattern) is "transferred" into a position of the pattern on the substrate by means of the projection system. Hence, a transfer function accuracy of the projection system translates into a position accuracy of the position of the pattern onto the substrate. A problem that may occur is that movements of the substrate table, movements of the mask table and/or movements of one or more other elements of the lithographic apparatus (which may occur e.g. during the scanning, exposure movements), may affect a position accuracy of one or more optical elements (lenses, mirrors) of the projection system. Such positioning inaccuracies may translate into inaccuracies of the projection of the pattern onto the substrate. Both positioning inaccuracies of the patterning device support (e.g. mask support), of the substrate table and of the projection system (induced by the accuracies of one or more optical elements in the projection system) influence the accuracy of the position of the projected image on the substrate. Position inaccuracies of the patterning device support (e.g. mask support) and substrate table are measured by their respective position measurement systems. Controllers attempt to minimize these errors by means of feeding back the error to the actuators connected to the patterning device support (e.g. mask support) and substrate table. Image position inaccuracy induced by inaccuracies of optical elements in the projection system are not measured.

In order to solve this problem, the lithographic apparatus according to an aspect of the invention is provided with a projection transfer measurement arrangement or system to measure an optical projection transfer information of the projection system during a movement, such as a scanning movement of one or more of the substrate table and the support. Thereto, the arrangement comprises an optical device to direct a measurement beam into the projection system, a detector to detect the measurement beam having passed through the projection system, and a measurement processing device or processor to determine the optical projection transfer information from the detected measurement beam. The optical projection transfer information may comprise any suitable projection parameter, such as a change in an in-plane image position a focus depth, an image plane tilt, etc. and may have any form, such as a digital signal, an analogue signal, etc. During the scanning movement, a measurement beam is directed through the projection system and detected by the detector. A displacement of an optical element (e.g. a lens, mirror etc) of the projection system may result in a change in a characteristic (e.g. a position, angle) of the measurement beam having traveled through the projection system, which characteristic may then be detected by the detector. An optical projection transfer information is derived from the thus detected signal, thereby providing information regarding the dynamic behavior of the projection system during a scanning movement. The optical projection transfer information may be provided as a correction signal to a positioning control of at least one of the support and the substrate table, so as to correct the position(s) thereof for the (e.g. dynamic, momentary) deviation in the optical transfer function of the projection system. Depending on the embodiment, parameters of the projection system to be measured by the measurement arrangement may comprise (a change in) an in-plane image position, a focus depth, an image plane tilt, a magnification ratio, etc. The measurement may be performed relatively, so as to measure a difference in respect of another measurement, e.g. performed by an alignment measurement system, such as a transmission image sensor (TIS) of an existing lithographic apparatus. The measurement may be performed during any scanning movement, such as a movement of the substrate table performed during a gridplate calibration or during "normal" exposures of a pattern onto a substrate.

Exposing the patterning device pattern onto the substrate normally takes place by synchronously moving the patterning device and the substrate through an illuminated slit. During this scan, the patterning device and substrate move with a constant velocity. The lens magnification determines the nominal ratio of the motion speeds, typically the lens has a magnification ratio of ¼, which requires the mask to move four times as fast as the substrate. During the scanning motion, the position accuracy with which the patterning device image is projected onto the substrate determines the quality of the exposure. Position deviations of the patterning device with respect to its desired movement profile, and position deviations of the substrate with respect to its desired profile, are determined by comparing the respective position measurements with the desired value during the scanning motion. An image position error induced by, e.g., lens vibrations, is however not directly measured. Momentary measurement of this projection system—induced image position error is greatly desired. First, such a measurement can be used in qualifying the proper operation of the system, by ensuring that lens-induced image position error is below a certain maximum threshold. Second, such a measurement can be used to control the patterning device support and/or the substrate table such that the lens-induced image position error is compensated.

As shown in the embodiments and will be described with reference to FIGS. 2-5, the optical device and the detector may be arranged at an upstream end of the projection system (i.e. at the end of the projection system where the radiation beam enters the projection system), which may allow the substrate table to move relatively unrestricted, e.g. performing a scanning movement. As a result, the optical projection transfer information may be determined during movements of the substrate table, so that effects of such movements on optical parts of the projection system may be taken into account during the measurements. Further details and embodiments are described with reference to the figures.

Figure 2A:
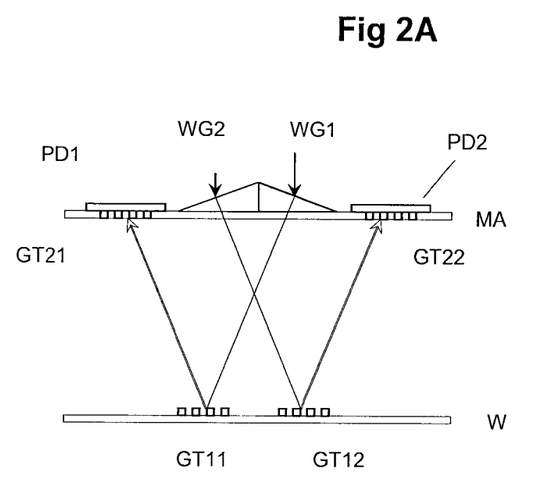
FIG. 2a-c schematically depict a measurement system of a lithographic apparatus according to an embodiment of the invention.
Figure 2B:
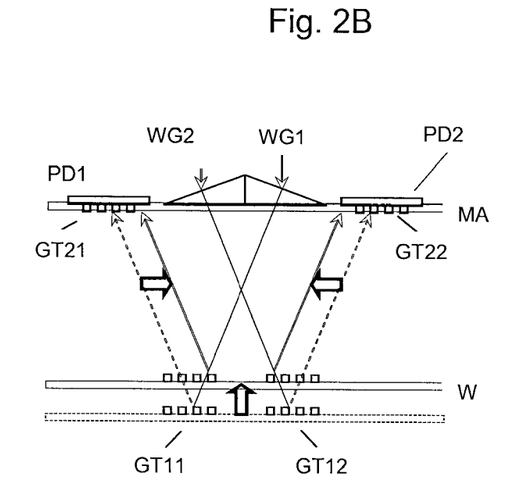
Figure 2C:
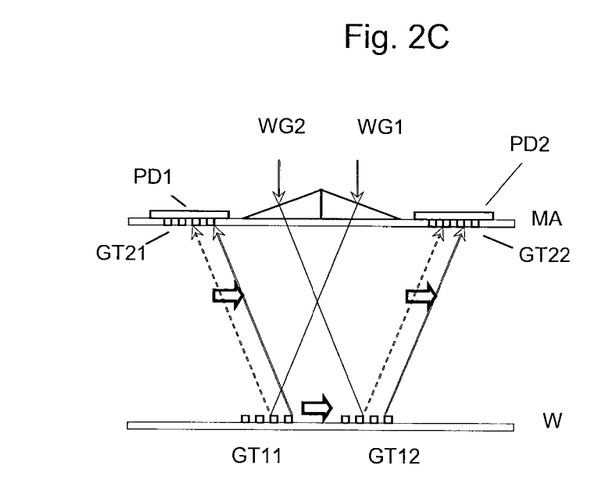

FIG. 2A depicts a substrate W and a patterning device MA. In a practical configuration, the projection system will be interposed between them. For illustrative purposes, the projection system has however been omitted in this drawing. The patterning device MA is in this embodiment provided with a wedge, in this example two wedges WG1, WG2 being provided. The wedge (which may form an embodiment of the above mentioned optical device), deflects a (e.g. small) part of the radiation beam so as to form the measurement beam. In this embodiment, the two wedges provide for two measurement beams. Each of the beams (after having passed through the projection system, i.e. after having been projected thereby), reaches a respective first grating GT11, GT12 provided on the substrate W. A part of the measurement beam is directed (e.g. reflected) from the respective first grating back into the projection system, and after having traveled there through, reaches a respective second grating GT21, GT22 provided on or in the patterning device. Thereby, each of the measurement beams has traveled through the projection system twice, namely downstream and upstream. Due to the interaction of the measurement beam with the respective first and second gratings, an intensity received by the respective detector PD1, PD2 which detects the respective measurement beam after having interacted with the second grating GT21, GT22, depends on a position or angle of the measurement beam reaching the respective second grating, which in turn depends on the optical projection of the projection system. The gratings GT11, GT22 may be formed as line patterns on the substrate W, extending in a direction perpendicular to the plane of drawing of FIG. 2A. Hence, the substrate W may perform a scanning movement in a direction substantially perpendicular to the plane of drawing, while the measurement beams are detected by the respective photo detector PD1, PD2. Essentially only a single wedge, a single first grating, a single second grating and a single photodetector would be required. In this embodiment however, such measurement system is provided in two fold, e.g. substantially symmetrical with respect to a line parallel to an optical axis of the projection system, as thereby not only horizontal information may be obtained, but also vertical information. This will be explained in more detail with reference to FIGS. 2B and 2C. In FIG. 2B, the substrate W has been displaced upwards (as indicated by the vertical arrow) which causes (due to the oblique direction of the measurement beam with respect to the optical axis of the projection system), a displacement of the incidence spot of the measurement beams on the second grating. This effect s schematically depicted in FIG. 2B, although it is to be understood that the displacements of wafer and measurement beams in this figure may be strongly exaggerated for illustrative purposes. The displacement of the measurement beam with respect to the second gratings will result in a change in detector output signal, as the measurement beams at the respective second gratings move towards each other. FIG. 2C depicts a situation wherein the substrate has been moved in a horizontal direction, which will cause the incidence of the measurement beams on the second gratings to displace similarly, as schematically indicated in FIG. 2C. Hence, by adding as well as subtracting the first and second detector output signals, a displacement in vertical as well as in horizontal direction may be detected. Similarly, as the measurement beams travel through the projection system, a change in the optical imaging transfer function of the projection system in vertical as well as in horizontal direction may be detected. By providing the first and second grating, detector(s) and the wedge(s) on the patterning device and on the substrate, the technique as described here may relatively easily be implemented in existing lithographic apparatuses. Furthermore, by applying the wedge as part of the optical device, no separate optical source is required and the optical characteristics of the projection system are detected simultaneously with and using a same wavelength as the exposure beam. By preparing a patterning device and substrate accordingly, the projection system contribution to the image position error can be determined in normal scanner operation of the lithographic tool. To this end, the photodetector output, converted into a position difference signal, needs to be compared with the position measurements of the mask support and substrate table. Detector output signals are provided to a measurement processing device or processor (not shown in the figures) for the above mentioned processing. Also, the measurement processing device or processor may derive a suitable correction signal, such as a feedforward signal or a setpoint correction, to be provided to a substrate stage and/or support positioning. The measurement processing device or processor may be formed by a separate processing device or processors and/or separate hardware, however it may also be comprised (e.g. as suitable software routines) in the substrate stage and/or support positioning hard- and/or software. In embodiments of the invention, there are provided multiple processors (e.g. for each detector) or one processor.

Figure 3:
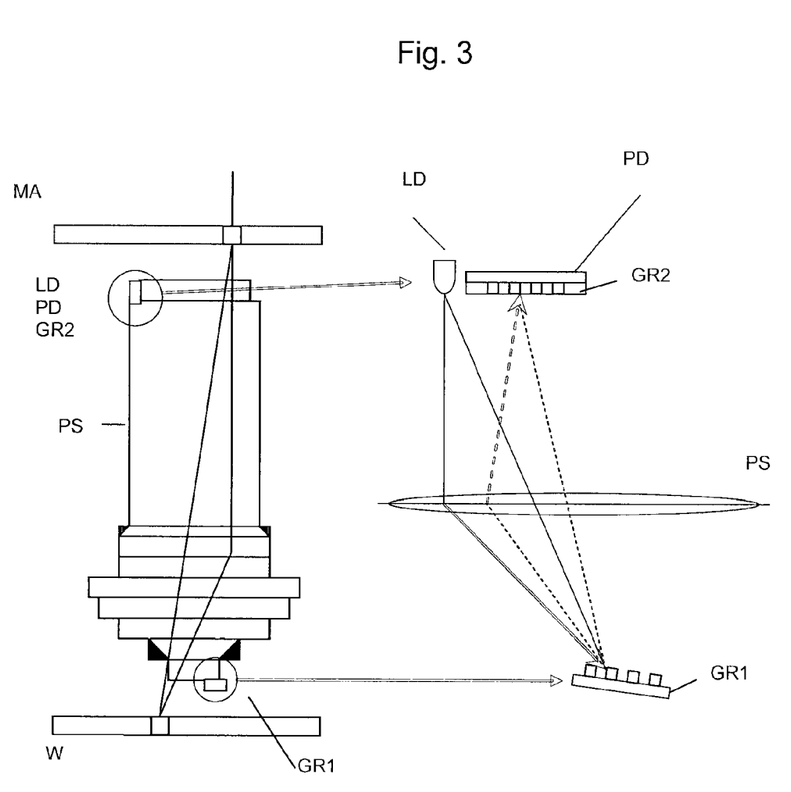
FIG. 3 schematically depicts a measurement arrangement of a lithographic apparatus according to another embodiment of the invention.
Figure 4:
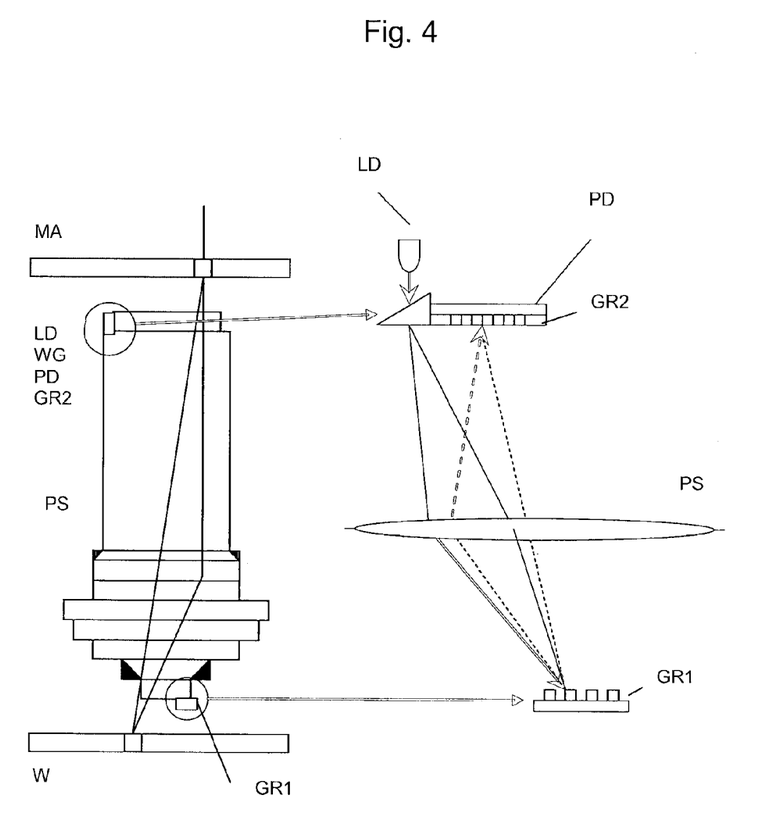
FIG. 4 schematically depicts a measurement arrangement of a lithographic apparatus according to yet another embodiment of the invention.
Figure 5:
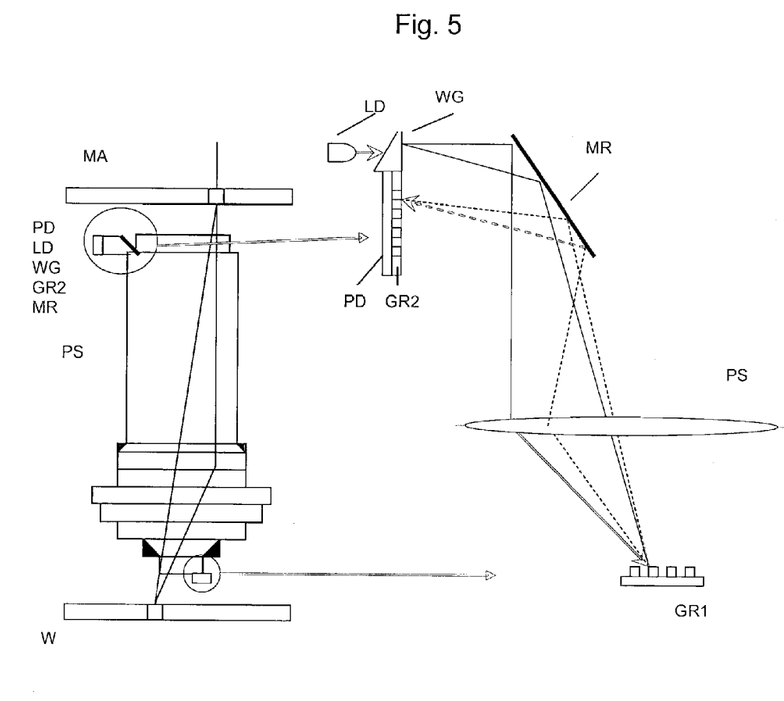
FIG. 5 schematically depicts a measurement arrangement of a lithographic apparatus according to still another embodiment of the invention.

FIGS. 3-5 each depict an embodiment of the invention wherein the optical device, gratings and detector are connected to the projection system instead of being provided in or on the mask and substrate. Thereby, the use of a special patterning device and substrate may be omitted, which allows to perform the measurements during regular operation of the lithographic apparatus.

FIG. 3 depicts a projection system PS, patterning device MA and substrate W. The radiation beam, patterned by the patterning device, is projected by the projection system onto the substrate. A light source LD (as optical device), such as a LED or laser diode, a second grating GR2 and a photo detector PD are provided at the upstream end of the projection system, i.e. at the side of the projection system where the pattered radiation beam enters it. A first grating GR1 is provided at the downstream end of the projection system, i.e. at the side where the patterned beam leaves it to be projected onto the substrate. At the right side of FIG. 3, a more detailed (functional) view of the light source LD, second grating GR2 and photo detector PD, as well as of the first grating GR1 is depicted. In this functional view, the projection system PS has been depicted as a single lens, although it is to be understood that a plurality of optical elements such as lenses, mirrors etc. may be applied. A measurement beam is emitted by the light source LD and is projected via the optical element or elements of the projection system onto the first grating GR1. From the first grating, the measurement beam again travels through the projection system so as to be incident on the second grating GR2, which is in this embodiment adjacent to the light source LD. In order to direct the measurement beam towards the second grating GR2, the first grating GR1 may be slightly tilted with respect to a focus plane of the projection system. Also, the light source may be slightly tilted with respect to the optical axis of the projection system so as to project the measurement beam obliquely through the projection system. A change in the optical projection transfer function (e.g. due to a slight displacement of a lens, a slight deformation due to heating of a lens or other part of the projection system, etc) may result in a change in the location of incidence of the measurement beam on the second grating GR2. Due to the optical interaction between the first and second gratings, such a change in the location of incidence may result in a change in the optical signal strength as received by the photo detector. It is remarked that one or more correction lenses may be required (not shown) in case the detector, source and/or gratings would be out of focus. LD, GR1/2 and PD are connected to the top and bottom of the projection system. A tilting (or any other low-frequent motion in another direction) of the projection system may lead to a relative position change of the projected image, because of limited stiffness by which lens elements are connected to the lens barrel (the so-called quasi-static effect).

Another embodiment is depicted in FIG. 4. FIG. 4, similarly to FIG. 3, depicts a projection system PS, patterning device MA and substrate W. The radiation beam, patterned by the patterning device, is projected by the projection system onto the substrate. A light source LD, such as a LED or laser diode, a second grating GR2 and a photo detector PD are provided at the upstream end of the projection system, i.e. at the side of the projection system where the pattered radiation beam enters it. A first grating GR1 is provided at the downstream end of the projection system, i.e. at the side where the patterned beam leaves it to be projected onto the substrate. At the right side of FIG. 4, a more detailed (functional) view of the light source LD, second grating GR2 and photo detector PD, as well as of the first grating GR1 is depicted. Similar to FIG. 3, in this functional view, the projection system PS has been depicted as a single lens, although it is to be understood that a plurality of optical elements such as lenses, mirrors etc. may be applied. A measurement beam is emitted by the light source LD and is projected via the optical element or elements of the projection system onto the first grating GR1. From the first grating, the measurement beam again travels through the projection system so as to be incident on the second grating GR2, which is in this embodiment adjacent to the light source LD. The light source LD may be provided with a wedge WG so as to project the measurement beam obliquely through the projection system in respect of the optical axis of the projection system. A change in the optical projection transfer function (e.g. due to a slight displacement of a lens, a slight deformation due to heating of a lens or other part of the projection system, etc) may result in a change in the location of incidence of the measurement beam on the second grating GR2. Due to the optical interaction between the first and second gratings, such a change in the location of incidence may result in a change in the optical signal strength as received by the photo detector. It is remarked that one or more correction lenses may be required (not shown) in case the detector, source and/or gratings would be out of focus.

A still further embodiment is depicted in FIG. 5. The embodiment depicted here can be considered a variation of the embodiment of FIG. 4, whereby the light source LD, second grating GR2, and photo detector PD are mirrored into the projection system optics by a mirror MR. Additionally or alternatively, the first grating may be mirrored into the projection system optics by a suitable mirror (not shown). The mirror may provide two benefits: firstly, some more freedom may be obtained in the positioning of elements such as the light source, detector and gratings, and secondly, an imaging of the measurement beam onto the first and second gratings may be improved as one or more of the light source, the first grating and the second grating may be positioned at a distance corresponding to an optical focus plane of the projection system.

Figure 6A:
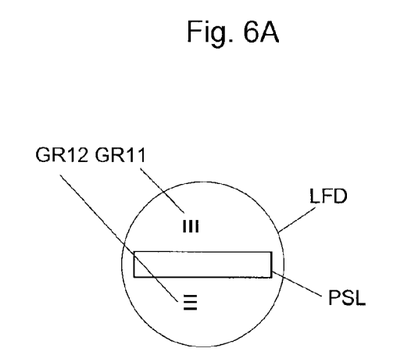
FIGS. 6A and 6B schematically depicts a top view of a lens field in accordance with some preferred embodiments of the invention.
Figure 6B:
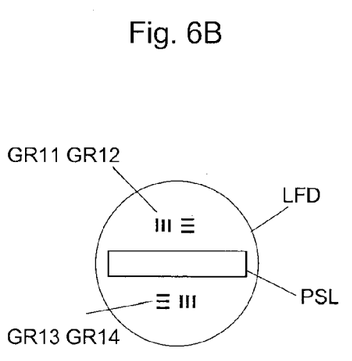

In each of the embodiments shown in FIGS. 3-5, use may be made of a single arrangement as depicted, however it is also possible to apply a plurality of similar arrangements. Thereby, more parameters with regard to the optical projection transfer may be obtained: for example a displacement of the optical projection in horizontal X and Y direction, in vertical Z direction, a tilting of the focus plane, a magnification, etc. An example will be explained with reference to FIGS. 6A and 6B. FIGS. 6A and 6B each depict a top view of a projection field ("lens field LFD"). The lens field comprises a slit projection area PSL through which a slit shaped part of the pattern of the patterning device may be projected onto the substrate. The slit projection area PSL will leave a part of the lens field free, which enables it to be used for the measurements of the optical projection. In the example, two measurement arrangements are provided, each projecting onto a first grating GR11, GR12 at opposite sides of the slit projection area PSL. In order to obtain information regarding the displacement of the projection in x and y direction, the first gratings GR11, GR12 may have lines extending perpendicularly to each other. In another example, as shown in FIG. 6B, 4 measurement arrangements are applied, two of them having a first grating GR11, GR12 at one side of the slit projection area, the other two having a first grating GR13, GR14 at the other side of the other side of the slit projection area. Hence, the measurement arrangements are located so as to be projected (seen in a direction parallel to the optical axis of the projection system) around the slit projection area PSL. The first gratings of two of the arrangements have lines extending perpendicular to the lines of the other two first gratings. This configuration enables to derive displacement, height and tilt of the projection.

Figure 7:
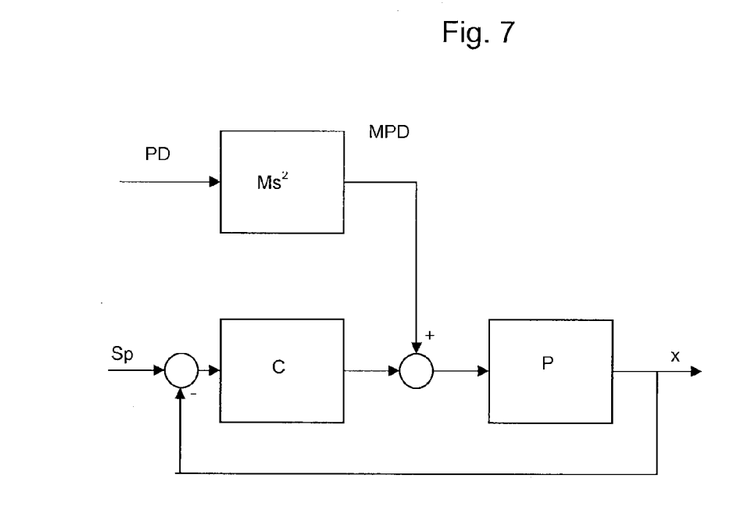
FIG. 7 depicts a block schematic control diagram of a lithographic apparatus positioning control in accordance with an embodiments of the invention.

In an embodiment, a lithographic apparatus according to an embodiment of the invention is provided with a controller C as shown in FIG. 7. The controller can be used to position the patterning device MA, the substrate W or both. Controller C may be a known type of positioning controller, such as a PID-controller.

Controller C is provided with a difference between a setpoint Sp comprising a desired trajectory of the plant P, and an actual position of plant P. The output of controller C is a control signal for controlling the position of plant P. Plant P may comprise the substrate W and possibly other components to position the substrate W, such as the substrate table WT and the second positioning device PW. Alternatively, plant P comprises the patterning device MA and possibly other components to position the patterning device MA, such as the patterning device support and the first positioning device PM. In response to the control signal plant P outputs an output x corresponding with the actual position of the substrate W or the patterning device Ma. In a feedback loop, output x is subtracted from the desired position of plant P.

Changes in the optical transfer function, such as vibrating lens elements, may cause the image of the patterning device to be projected onto the substrate W with an undesired offset. This offset may be in the plane of the target portion surface of the substrate W, which may lead to misplacement of the image on the substrate. The offset may also be in a direction perpendicular to the target portion surface, which may lead to a focus error.

The effects of the offset may be reduced by correcting the position of either the substrate W, the patterning device Ma or both. For example, when the image has an offset in a certain direction, the substrate W may be moved the same amount in that direction, such that the image is projected onto the desired location on the substrate W.

The lens elements may vibrate at a frequency that is higher than the bandwidth of the controller C. A typical frequency at which the lens elements vibrate may be around 300 Hz. Because of this high frequency, it may be difficult to sufficiently control the position of the plant P to correct for the offset.

The position can be corrected e.g. for the above and/or other effects by using the output signal of the photo detector PD and add this to the output of controller C, preferably after having been processed by e.g. the measurement processing device MPD so as to provide a suitable signal, a suitable form of optical projection transfer information, etc. In case the signal of photo detector PD relates to a position, it may be needed to correct the signal before adding it to the output of controller C. For example, the signal of photo detector may be differentiated twice with respect to time and multiplied by the mass of the plant, as illustrated with block $Ms^2$.

A benefit of adding the output of the photo detector PD to the output of controller C is that the high frequency contents of the output of the photo detector PD is provided directly to the plant P and not through controller C. This way the offset of plant P can be corrected at a higher frequency than the bandwidth of the controller C. High frequency lens vibration may be corrected for this way, without reducing the stability of the control loop.

It will be understood that the first gratings may also be mirrored into the projection system, in which case the directions of the gratings are to be understood so as to have the above stated orientation when mirrored into the projection system.

It is noted that in all above embodiments, the gratings will provide for a periodicity in signal as provided by the detector. In order to obtain optimum sensitivity, a zero crossing position in a response curve may be applied.

Furthermore, the first and second gratings may reflect the measurement beam in any suitable way, thereby the term reflection not being restricted to a pure reflection, but also including deflection or any other suitable interaction of the measurement beam with the grating.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate;
    a projection transfer measurement system configured to measure an optical projection transfer information of the projection system during a scanning movement of the substrate table in which the patterned radiation beam is projected onto the target portion of the substrate, the projection transfer measurement system comprising:
        an optical device configured to direct a measurement beam into the projection system,
        a detector configured to detect the measurement beam having passed through the projection system,
        a first optical element to reflect at least part of the measurement beam, after having passed the projection system, back into the projection system during the scanning, and a measurement processor configured to determine the optical projection transfer information from the detected measurement beam, wherein the optical device and the detector are arranged at an upstream end of the projection system, and wherein the projection transfer measurement system is arranged so that, in use during the scanning, the at least part of the measurement beam reflected by the first optical element is detected by the detector without interacting with said optical device.

2. The lithographic apparatus according to claim 1, wherein the first optical element is a first grating and wherein the projection transfer measurement system further comprises:

a second grating placed in front of the detector to receive the measurement beam as reflected by the first grating.

3. The lithographic apparatus according to claim 2, wherein the optical device comprises a wedge to deflect a part of the radiation beam.

4. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate;
a projection transfer measurement system configured to measure an optical projection transfer information of the projection system, the projection transfer measurement system comprising:
an optical device configured to direct a measurement beam into the projection system,
a detector configured to detect the measurement beam having passed through the projection system,
a first grating to reflect at least part of the measurement beam, after having passed the projection system, back into the projection system;
a second grating placed in front of the detector to receive the measurement beam as reflected by the first grating, and
a measurement processor configured to determine the optical projection transfer information from the detected measurement beam, wherein the optical device and the detector are arranged at an upstream end of the projection system,
wherein the optical device comprises a wedge to deflect a part of the radiation beam, and
wherein the wedge and the second grating are provided on the patterning device, the first grating being provided on the substrate.

5. The lithographic apparatus according to claim 4, wherein two measurement arrangements are provided, which are in use arranged substantially symmetrically with respect to a line substantially parallel to an optical axis of the projection system, vertical and horizontal positioning information being calculated from output signals of the measurement arrangements.

6. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate;
a projection transfer measurement system configured to measure an optical projection transfer information of the projection system, the projection transfer measurement system comprising:
an optical device configured to direct a measurement beam into the projection system,
a detector configured to detect the measurement beam having passed through the projection system,
a first grating to reflect at least part of the measurement beam, after having passed the projection system, back into the projection system;
a second grating placed in front of the detector to receive the measurement beam as reflected by the first grating, and
a measurement processor configured to determine the optical projection transfer information from the detected measurement beam, wherein the optical device and the detector are arranged at an upstream end of the projection system,
wherein the optical device, the first grating and the second grating are connected to the projection system, the optical device and the second grating are provided at an upstream optical element of the projection system, the first grating being provided at a downstream optical element of the projection system.

7. The lithographic apparatus according to claim 6, wherein two measurement arrangements are provided, the first gratings of which having lines extending substantially perpendicular to each other.

8. The lithographic apparatus according to claim 6, wherein four or more measurement arrangements are provided, the first gratings of two of the measurement arrangements having lines extending substantially perpendicular to the first gratings of the two other measurement arrangements, the first gratings of the measurement arrangements being located so as to be projected, as seen in a direction substantially parallel to the optical axis of the projection system, around a patterning device slit projection area of the projection system.

9. The lithographic apparatus according to claim 6, wherein the measurement arrangement comprises a tilted mirror to mirror the first grating or a combination of the second grating and the detector into the projection system.

10. The lithographic apparatus according to claim 9, wherein two measurement arrangements are provided, the first gratings of which having lines extending substantially perpendicular to each other when mirrored into the projection system by the respective tilted mirrors.

11. The lithographic apparatus according to claim 9, wherein four measurement arrangements are provided, the first gratings of two of the measurement arrangements having lines extending substantially perpendicular to the first gratings of the two other measurement arrangements when mirrored into the projection system by the respective tilted mirrors, the first gratings of the measurement arrangements being located so as to be projected, as seen in a direction substantially parallel to the optical axis of the projection system, around a patterning device slit projection area of the projection system.

12. A patterning device configured to pattern a radiation beam in a lithographic apparatus, the patterning device comprising a wedge and a combination of a grating and a detector.

* * * * *